United States Patent
Dattner et al.

(10) Patent No.: US 8,610,049 B2
(45) Date of Patent: Dec. 17, 2013

(54) APPARATUS, SYSTEM, AND METHOD FOR EMISSION FILTER HAVING A SOLUTION WITH POLAR PROTIC SOLVENT

(75) Inventors: Yonathan Dattner, Calgary (CA); Lior Blockstein, Calgary (CA); Orly Yadid-Pecht, Calgary (CA)

(73) Assignee: UTI Limited Partnership, Calgary (CA)

( * ) Notice: Subject to any disclaimer, the term of this patent is extended or adjusted under 35 U.S.C. 154(b) by 322 days.

(21) Appl. No.: 12/962,414

(22) Filed: Dec. 7, 2010

(65) Prior Publication Data

US 2011/0133056 A1 Jun. 9, 2011

Related U.S. Application Data

(60) Provisional application No. 61/267,310, filed on Dec. 7, 2009.

(51) Int. Cl.
*G01J 3/50* (2006.01)

(52) U.S. Cl.
USPC .......................................... 250/226; 250/239

(58) Field of Classification Search
USPC ............... 250/226, 239, 208.1; 252/582–588; 359/350–359, 885
See application file for complete search history.

(56) References Cited

U.S. PATENT DOCUMENTS 6,775,059 B2* 8/2004 Kuwabara ..................... 359/359
8,337,728 B2* 12/2012 Ishida et al. .................. 252/586

OTHER PUBLICATIONS

Auroux et al., "Micro Total Analysis Systems. 2. Analytical Standard Operations and Applications," *Analytical Chemistry* 74(12): 2637-2652, 2002.
Axelrod et al., "Fluorescence Microscopy," in Olympus Microscopy Resource Center online, 2010, retrieved from http://www.olympusmicro.com/primer/techniques/fluorescence/fluorhome.html, retrieved on Aug. 8, 2011.
Beiderman et al., "A Low-Light CMOS Contact Imager With an Emission Filter for Biosensing Applications," *IEEE Transactions on biomedical circuits and systems* 2(3): 193-203, Sep. 2008.
Burns et al., "An Integrated Nanoliter DNA Analysis Device," *Science* 282(5388): 484-487, 1998.
Chediak et al., "Heterogeneous integration of CdS filters with GaN LEDs for fluorescence detection microsystems," *Sensors and Actuators A: Physical* 111: 1-7, 2004.
Dandin et al., "Optical filtering technologies for integrated fluorescence sensors," *Lab on a Chip* 7: 955-977, 2007.
Dattner and Yadid-Pecht, "Low Light CMOS Contact Imager with an Integrated Poly-Acrylic Emission Filter for Fluorescence Detection," *Sensors* 10: 5014-5027, 2010.
De Giglio et al., "Analytical investigations of poly(acrylic acid) coatings electrodeposited on titanium-based implants: a versatile approach to biocompatibility enhancement," *Analytical and Bioanalytical Chemistry* 389: 2055-2063, 2007.
Ghallab and Badawy, "Sensing methods for dielectrophoresis phenomenon: from bulky instruments to lab-on-a-chip," *IEE Circuits and Systems Magazine* 4: 5-15, 2004.

(Continued)

*Primary Examiner* — Que T Le
(74) *Attorney, Agent, or Firm* — Fogarty, L.L.C.

(57) ABSTRACT

An apparatus, system, and method for emission filter. A filter apparatus is presented. In one embodiment, the filter apparatus may be adapted for fluorescence spectroscopy. In a particular embodiment, the filter apparatus comprises a solution. The solution may include a polar protic solvent and an absorbing specimen. Additionally, the filter apparatus may include an adhesive to conform the solution into a solid filter.

20 Claims, 11 Drawing Sheets

(56) References Cited

OTHER PUBLICATIONS

Guo et al., "Synthesis of Biocompatible Polymeric Hydrogels with Tunable Adhesion to both Hydrophobic and Hydrophilic Surfaces," *Biomacromolecules* 9: 1637-1642, 2003.

Hofmann et al., "Monolithically integrated dye-doped PDMS long-pass filters for disposable on-chip fluorescence detection," *Lab on a Chip* 6: 981-987, 2006.

Ji et al., "Contact imaging: simulation and experiment," *IEEE Trans Circuits and Systems I: Regular Papers* 54: 1698-1710, 2007.

Ji et al., "Integrated fluorescence sensing for lab-on-a-chip devices," *IEEE/NLM Life Science Systems and Applications Workshop* Bethesda, MD: 1-2, 2006.

Ng et al., "On-chip biofluorescence imaging inside a brain tissue phantom using a CMOS image sensor for in vivo brain imaging verification," *Sensors and Actuators B: Chemical* 119: 262-274, 2006.

http://microscope.olympus.com/ga/applications/Fluo_Applciations_E/fa_p14_e.html.

Reyes et al., "Micro Total Analysis Systems. 1. Introduction, Theory, and Technology," *Analytical Chemistry* 74: 2623-2636, 2002.

Richard et al., "An integrated hybrid interference and absorption filter for fluorescence detection in lab-on-a-chip devices," *Lab on a Chip* 9: 1371-1376, 2009.

Salama et al., "Modeling and simulation of integrated luminescence detection platforms," *Proc SPIE* 4966:106-116, 2003.

Salama et al., "Modeling and simulation of luminescence detection platforms," *Biosensors and Bioelectronics* 19: 1377-1386, 2004.

Tam et al., "A CMOS Contact Imager for Cell Detection in Bio-Sensing Applications," *IEEE International Symposium on Circuits and Systems* New Orleans, LA: 813-816. May 27-30, 2007.

* cited by examiner

APPARATUS, SYSTEM, AND METHOD FOR EMISSION FILTER HAVING A SOLUTION WITH POLAR PROTIC SOLVENT

RELATED APPLICATION

This application claims priority to U.S. Provisional Application Ser. No. 61/267,310 filed Dec. 7, 2009, the entire text of which is specifically incorporated herein by reference without disclaimer.

BACKGROUND OF THE INVENTION

1. Field of the Invention

This invention relates to absorption filter technology and more particularly relates to an apparatus system and method for poly-acrylic and polyvinyl based emissions filters.

2. Description of the Related Art

Fluorescence spectroscopy may be a key component of future micro-total-analysis-systems (uTASs), which may integrate the capabilities of entire laboratories onto compact devices consisting of microchips and other micro-fabricated elements (Lab-on-a-chip). A major component in fluorescence analysis is the optical filter that separates the excitation light from the fluorescence emission. Ideally, the optical filter component should be monolithically integrated to the lab-on-a-chip device, as well as simple to fabricate at low cost.

One simple approach to building a miniaturized imaging system capable of micro scale resolution is to directly couple the sensor array with the sample of interest, referred to as Contact Imaging. Contact image sensors, compared with conventional imagers, do not require optical elements, such as lenses between the sample and the sensor array, providing better collection efficiency without optical loss. Because of the very short distance between objects and the sensor surface, contact imaging systems have much greater collection efficiency. For objects in close proximity with the sensor surface, the contact imager subtends nearly $2\pi$ of the total solid angle, so the collection efficiency can be as high as 50% for samples that emit light. It was estimated that the optical efficiency of a contact imaging system is improved by 35 dB in comparison with camera-based imaging system.

Therefore it is possible to use a low power LED as an illumination source for dark objects because the improvement in collection efficiency allows the detection of a weak signal. The distance between the object of interest and the sensor array is mainly determined by the thickness of the optical filter and therefore thin filters are desired.

The earliest types of filters used at the micro-scale were interference filters or dichroic filters. An interference filter consists of multiple thin layers of dielectric material having different refractive indices and there also may be metallic layers. Interference filters are wavelength-selective by virtue of the interference effects that take place between the incident and reflected waves at the thin-film boundaries. The advantages with interference filters is that they can be fabricated using standard, low-temperature processes, they are compatible with integrated circuitry, can be readily integrated into larger microscale systems and arbitrary spectral profiles can be obtained using different layer arrangements. There are some serious disadvantages to interference filters, a variation of a few nanometers in the thickness of the layers can cause large errors in the cutoff wavelength, up to ±50 nm. Another limitation is that the spectral response of these filters depends on the angle of incidence of the incoming light. This is a major drawback in contact imaging due to the close proximity of the object of interest with the sensor array (<100 μm). Finally, it is not yet feasible to fabricate multiple filters of this type for different colors on one surface.

The referenced shortcomings are not intended to be exhaustive, but rather are among many that tend to impair the effectiveness of previously known techniques in fluorescence spectroscopy; however, those mentioned here are sufficient to demonstrate that the methodologies appearing in the art have not been satisfactory and that a significant need exists for the techniques described and claimed in this disclosure.

SUMMARY OF THE INVENTION

A filter apparatus is presented. In one embodiment, the filter apparatus may be adapted for fluorescence spectroscopy. In a particular embodiment, the filter apparatus comprises a solution. The solution may include a polar protic solvent and an absorbing specimen. Additionally, the filter apparatus may include an adhesive to conform the solution into a solid filter.

In a further embodiment, the polar protic solvent may include ethyl-alcohol. The polar protic solvent may also be methyl-alcohol. Additionally, the absorbing specimen may include a dye. For example, an Atrozan Orange G dye may be selected for the absorbing specimen. In some embodiments, the absorbing specimen may be Benzophenone-8 (2,2-hydroxy-4-methoxybenzophone). Also, the adhesive may include a poly acrylic acid partial sodium salt solution. In some embodiments, the adhesive may include polyvinyl acetate.

In certain embodiments, the filter may absorb a substantial portion of light having a wavelength in the range of 510 nm to 570 nm. Additionally, the filter may pass a substantial portion of light having a wavelength in the range of 620 nm to 680 nm. In some embodiments, the filter may absorb a substantial portion of light having a wavelength in the range of 340 nm and 380 nm. For example, the filter may be configured to provide an attenuation of −80 dB for light having a wavelength of 340 nm. Additionally, the filter may pass a substantial portion of light having a wavelength of 510 nm. For example, the filter may be configured to provide an attenuation of −1 dB for light having a wavelength of 510 nm.

A system is also presented. In one embodiment, the system includes a Complimentary Metal-Oxide Semiconductor (CMOS) imager having a sensor array. The system may also include an absorption filter coupled to the sensor array. In one embodiment, the absorption filter includes a solution having a polar protic solvent and an absorbing specimen. The solution may be mixed with an adhesive to conform the solution into a solid filter. In a further embodiment, the system may include a light source configured to direct light toward the sensor array.

For example, the light source may emit substantially green light having a wavelength between 510 nm and 570 nm. In a particular embodiment, the light source may be configured to illuminate a bio-material, such as an organic compound located in a region proximal to the sensor array. For example, the bio-material may be placed on the surface of the filter, and the light source may illuminate the bio-material, thereby illuminating the filter. In one embodiment, the filter may substantially block the light from the light source, but substantially pass light from the resultant fluorescence of the bio-material through to the sensor array. In particular, the filter may be configured such that it substantially blocks light of a first wavelength from the light source, but substantially passes light of a second wavelength, where the second wavelength corresponds to the wavelength of light emitted by the bio-material as a result of fluorescence of the bio-material in response to excitation of the light from the light source.

A method of manufacturing an absorption filter is also presented. In one embodiment, the method includes providing a polar protic solvent, preparing a solution by dissolving an absorbing specimen in the polar protic solvent, preparing a mixture by mixing the solution with an adhesive, pouring the mixture over a sensor array to a desired thickness, and curing the mixture. In some embodiments, the method may include spinning the mixture before it is cured. In a particular embodiment, the method may include providing a predetermined arrangement of a Room Temperature Vulcanizing (RTV) sealant to act as a barrier for the mixture until the mixture is cured. In such an embodiment, the thickness of the absorption filter is set according to a thickness of the RTV sealant.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Absorption filters are an alternative to interference filters, they are single layer filters that have high absorption at the excitation wavelength and low aborption at the emission wavelength. They are governed by Beer Lambert Law for liquids: $I=I_0 * 10^{-\in lc}$, where I is the intensity of the light after the filter, $I_0$ is the intensity of the incident light, $\in$ is the molar absorptivity of the absorber, l is the thickness of the filter and c the concentration of the absorbing species in the material.

Four parameters that characterize optical filters are rejection levels in the stopband (the wavelengths that are blocked), transmission levels in the passband (the wavelengths that are transmitted), the location of the transition known as the absorption edge, and the sharpness of the transition known as the absorption edge width or roll-off. The first two metrics are based on the absorbance, which is defined as minus the base 10 logarithm of the transmittance ($T=I_t/I_0$) which is the ratio of the output light intensity to the incident light intensity; $A=-\log(T)=\log(I_0/I_t)$. The absorbance includes losses due to absorption, reflection and scattering. Intensity is defined as power per unit area. The present embodiments are described in terms of rejection and transmittance levels in [dB]; $10*\log(I_0/I_t)=10\,A$.

Figure 1:
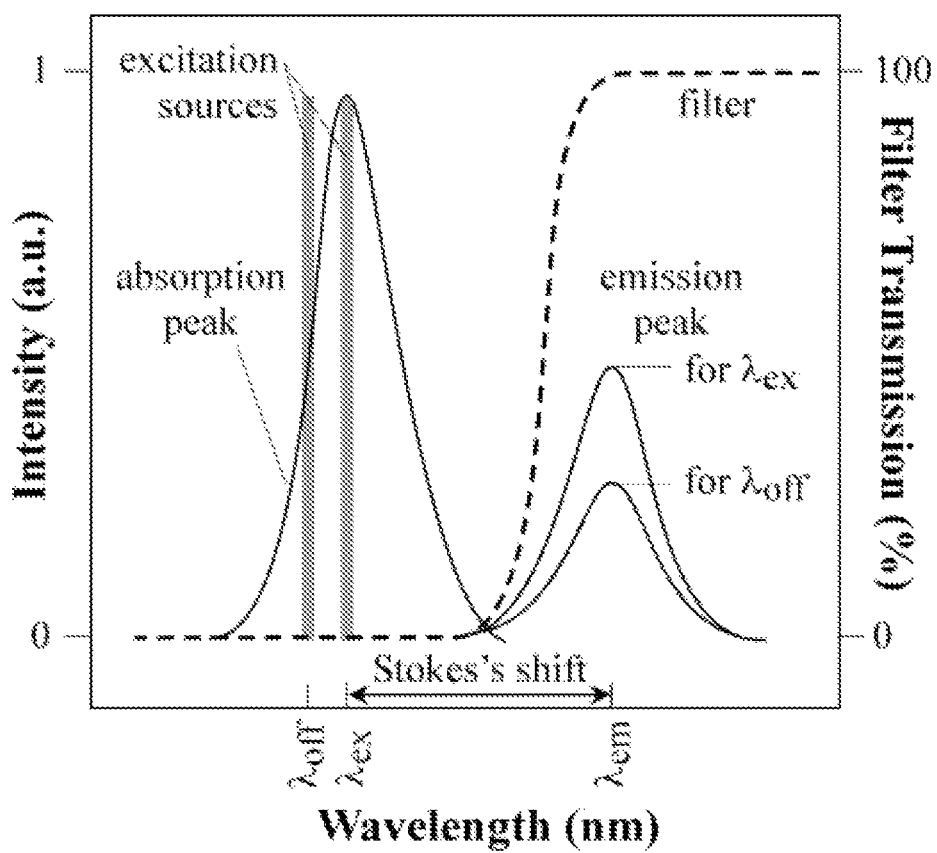
FIG. 1 is graphical representation illustrating typical peaks in the excitation (left) and emission (right) spectra, in arbitrary units, of a filter configured for use with fluorescence spectroscopy. The wavelength filter (dashed line) must reject the excitation light and transmit the emitted fluorescent light. Excitation with off-peak ($\lambda_{off}$) lowers the emission intensity.

An ideal filter would transmit 0% ($-\infty$ dB) of the excitation light and 100% (0 dB) of the fluorescence emitted light, the absorbance edge to be vertical and located to the right of $\lambda_{ex}$ and to the left of the entire emission spectrum. In reality, these levels are typically unattainable, and the stopband transitions to the passband over a range of wavelengths. The roll-off width must be small enough to fit within the Stokes shift, as illustrated in FIG. 1. Otherwise, the fluorophore cannot be excited at the absorption peak, or all the emitted light can not be collected, both of which decrease sensitivity.

Although the present embodiments are generally described in the context of fluorescence spectroscopy as one example, these embodiments may be used in various applications where the Stokes shift can be used advantageously. For example, many applications require illuminating a sample in one wavelength and measuring responsive results in another wavelength. For example, one possible alternative application may include detection of micro-organisms that would not otherwise be detectable.

The present embodiments describe the fabrication of a low cost emission filter integrated with a low light CMOS contact imager. In particular, one embodiment may include a poly-acrylic acid (PAA) based filter for fluorescence detection. Additionally, the present embodiments include a process for manufacturing the filter. In a particular embodiment, the process may include the use of poly-acrylic acid partial sodium salt solution as an adhesive for the emission filter. The poly-acrylic solution may be chosen due its optical transparent properties, adhesive properties, miscibility with polar protic solvents and most importantly its bio-compatibility with a biological environment. The process for manufacturing an emission filter, also know as an absorption filter, may include dissolving an absorbing specimen in a polar protic solvent and mixing it with the PAA to uniformly bond the absorbing specimen and harden the filter. The PAA is optically transparent in solid form and therefore may not appreciably contribute to the absorbance of light in the visible spectrum. In a first example of implementation of the present embodiments, an emission filter may be fabricated using Astrazon Orange G dye as an absorbing specimen and dissolved in ethyl-alcohol for the polar protic solvent. The solution may be mixed with the PAA, spun and let to cure until the ethyl-alcohol fully evaporated. A filter manufactured according to such a process may have excitation in the green spectrum and emission in the red spectrum, utilizing the increased quantum efficiency of the photo sensitive sensor array. The thickness of the filter may be adjustable during manufacture. In one example, a filter having a thickness of 20 μm was chosen by calculating the desired SNR using Beer-Lambert's law for liquids, Quantum Yield of the fluorophore and the Quantum Efficiency of the sensor array. A filter according to such an embodiment may be suitable for excitation wavelengths from 490 nm to 590 nm and emission from 610 nm and above. In one embodiment, such a filter may exhibit a maximum attenuation of −60 B at 570 nm and a minimum attenuation of −1.6 dB at 650 nm. Additionally, such an embodiment of a filter may have a roll-off of 20 nm, which may allow good contrast imaging and may be suitable for low light fluorescence detection. The filter may be integrated with a fully functional low noise, low light CMOS contact imager. Additionally, experimental results using fluorescence polystyrene micro-beads are described.

Figure 2:
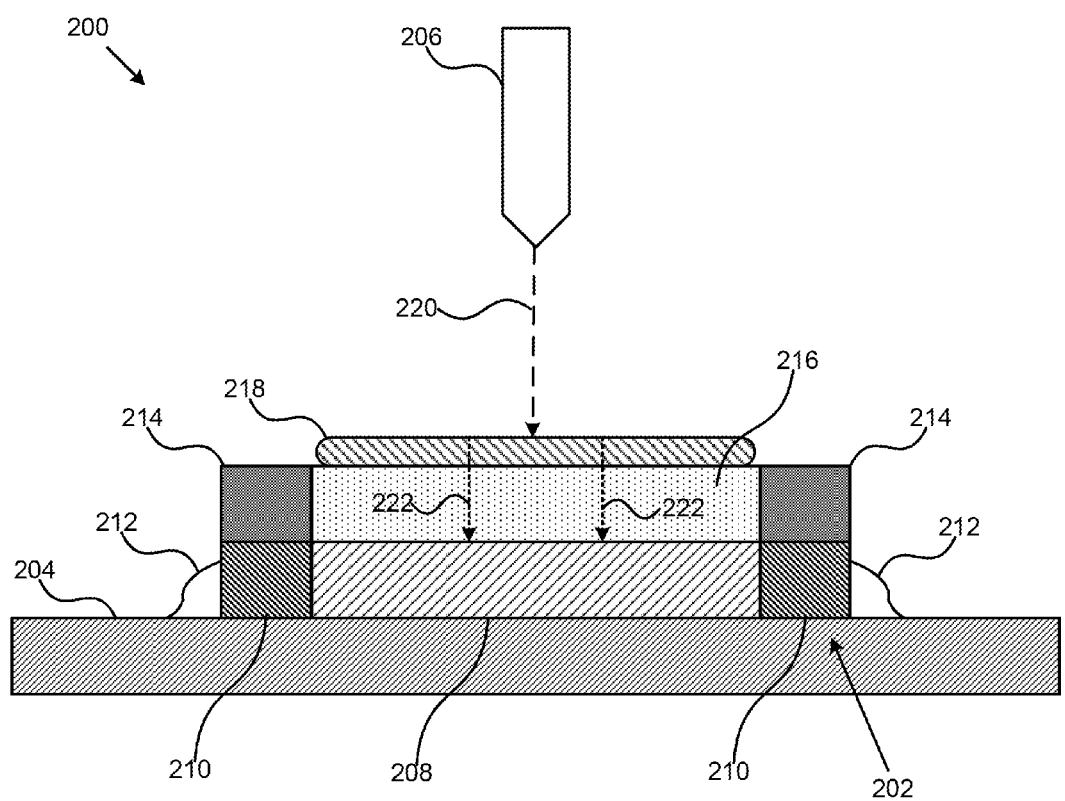
FIG. 2 is a schematic block diagram illustrating one embodiment of a system for fluorescence spectroscopy in accordance with the present embodiments.

FIG. 2 illustrates one embodiment of a system 200 according to the present embodiments. In one embodiment, the system 200 may include a Complimentary Metal-Oxide Semiconductor (CMOS) imager 202 having a sensor array 208. The system 200 may also include an absorption filter 216 coupled to the sensor array 208. In one embodiment, the absorption filter 216 may include a solution having a polar protic solvent and an absorbing specimen. The solution may be mixed with an adhesive to conform the solution into a solid filter 216. In a further embodiment, the system 200 may include a light source 206 configured to direct a beam of light 220 having a first frequency toward the sensor array 208.

In one embodiment, the CMOS imager 202 may be mounted on a circuit card 204. The CMOS imager 202 may be coupled to the circuit card 204 via one or more contact pins 212. The CMOS imager 202 may include a sensor array 208. Additionally, the CMOS imager 202 may include peripheral circuitry 210 for, e.g., conversion of signals received by the sensor array 208, communication with other components, etc.

In one embodiment, the filter 216 may be formed directly over the sensor array 208. For example, an RTA sealant 214 may be formed over the peripheral circuitry 210. In one embodiment, the region over the sensor array 208 may remain clear of RTA sealant 214. In such an embodiment, the RTA sealant 214 may substantially act as a form or retention wall for the liquid filter solution during a curing process. In such an embodiment, the filter 216 may take on a shape of a void in the RTA sealant layer 214.

In one embodiment, the filter may include various absorbing specimens, including several various dyes. For example, the dyes may include, but are not limited to, Astrazon orange G powder dye, Zincon R.G powder dye, Azure A chloride powder dye, Azure B, Sudan II, solvent green, solvent blue, and the like. Example adhesives may include polyester resin, PDMS, fiberglass resin, liquid hardener, clear glue, and the like. These various combinations of solvents, absorbing specimens, and adhesives may be selected according the light characteristics of a desired application.

For example, the light source 206 may emit substantially green light 220 having a wavelength of between 510 nm and 570 nm. In a particular embodiment, the light source 206 may be configured to illuminate a bio-material 218, such as an organic compound located in a region proximal to the sensor array 208. For example, the bio-material 218 may be placed on the surface of the filter 216, and the light source 208 may illuminate the bio-material 218, thereby illuminating the filter 216. In one embodiment, the filter 216 may substantially block the light 220 from the light source 206, but substantially pass light 222 from the resultant fluorescence of the bio-material 218 through to the sensor array 208. In particular, the filter 216 may be configured such that it substantially blocks light 220 of a first wavelength from the light source 206, but substantially passes light 222 of a second wavelength, where the second wavelength corresponds to the wavelength of light emitted by the bio-material 218 as a result of fluorescence of the bio-material 218 in response to excitation of the light 220 from the light source 206.

In one example embodiment, the polar protic solvent may include ethyl-alcohol. Additionally, the absorbing specimen may include a dye. For example, an Atrozan Orange G dye may be selected for the absorbing specimen. Also, the adhesive may include a poly acrylic acid partial sodium salt solution. In such an embodiment, the filter 216 may absorb a substantial portion of light 220 having a wavelength in the range of 510 nm to 570 nm. Additionally, the filter may pass a substantial portion of light 222 having a wavelength in the range of 620 nm to 680 nm.

Figure 3:
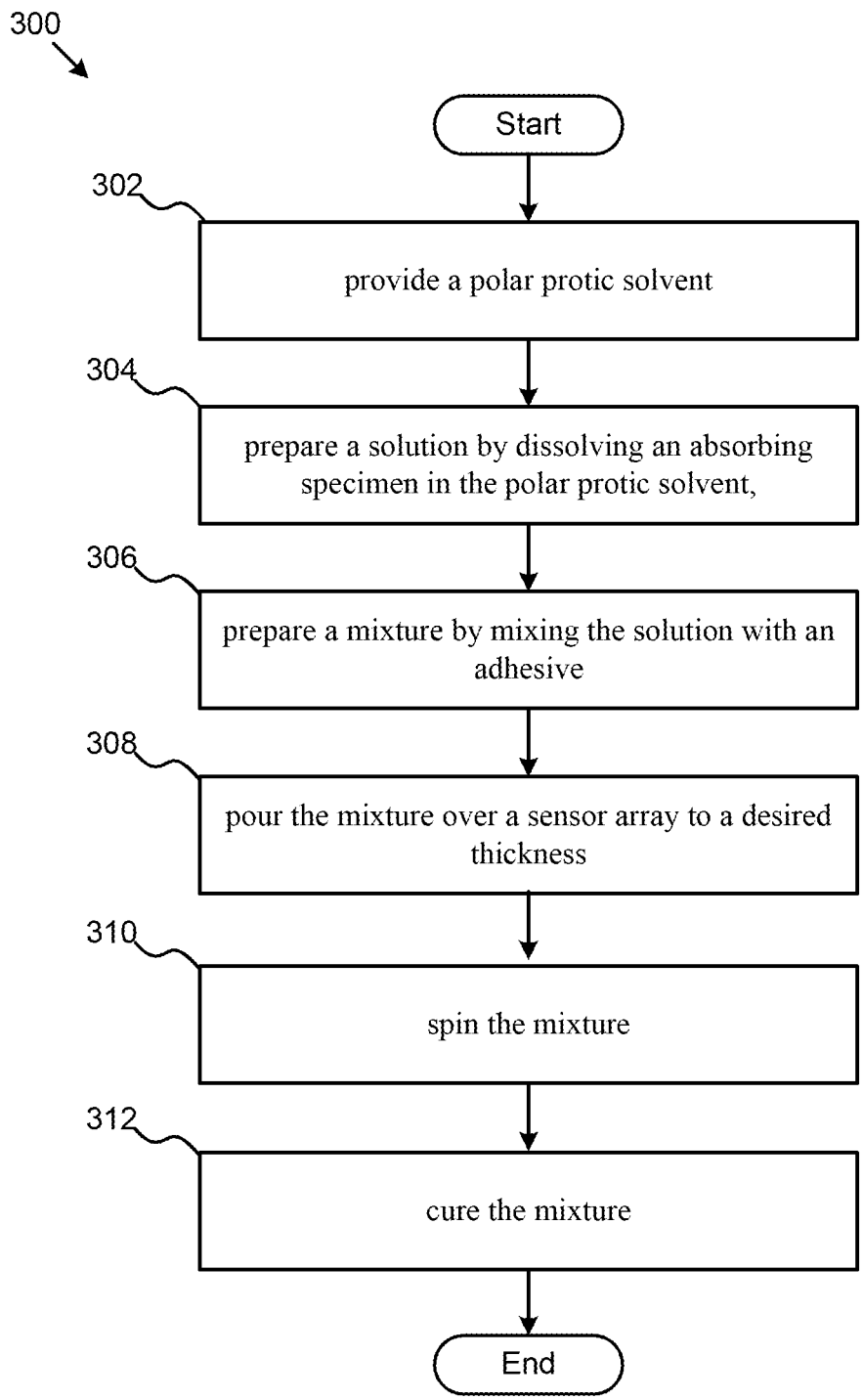
FIG. 3 is a schematic flow chart diagram illustrating one embodiment of a method for manufacturing an absorption filter according to the present embodiments.

FIG. 3 illustrates one embodiment of a method 300 for manufacturing an absorption filter 216. In one embodiment, the method 300 includes providing 302 a polar protic solvent, preparing 304 a solution by dissolving an absorbing specimen in the polar protic solvent, preparing 306 a mixture by mixing the solution with an adhesive, pouring 308 the mixture over a sensor array to a desired thickness, spinning 310 the mixture, and curing 312 the mixture.

In a particular embodiment, the method may include providing a predetermined arrangement of a Room Temperature Vulcanizing (RTV) sealant to act as a barrier for the mixture until the mixture is cured. In such an embodiment, the thickness of the absorption filter is set according to a thickness of the RTV sealant.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

EXAMPLES

Fluorescence spectroscopy or spectrofluorometry, is a type of electromagnetic spectroscopy which analyzes fluorescence from a sample which can be intrinsic to the specimen under study 218, introduced into it, or chemically bound to it. It involves using a beam of light 220, which excites the electrons in molecules of certain compounds and causes them to emit light 222 of a lower energy, typically, but not necessarily, visible light. Molecules have various states referred to as energy levels. Fluorescence spectroscopy is primarily concerned with electronic and vibrational states. Generally, the species being examined will have a ground state (a low energy state) of interest, and an excited state of higher energy.

A model absorption spectrum illustrated for a generic fluorophore in FIG. 1 has a peak at $\lambda_{ex}$, and the emission spectrum has a peak at $\lambda_{em}$. The distance between $\lambda_{ex}$ and $\lambda_{em}$ is called the Stokes Shift. Stokes shift can be as small 10 nm or as large as 150 nm (Fura-2), depending on the fluorophore.

If the fluorophore is excited at an off-peak wavelength $\lambda_{off}$, the resulting fluorescence spectrum may be unchanged but will have lower amplitude than if it is excited at $\lambda_{ex}$. The number of photons emitted is typically much smaller then the number absorbed, reflecting the existence of non-radiative pathway for the decay of the fluorophore from its excited state. The ratio of the emitted to absorbed photons is the quantum yield of the fluorophore.

Fluorescence may be detected visually, for example using a fluorescence microscope, or it may be converted to an electrical signal and detected in such devices as CMOS imagers 202. There have been many advances in CMOS imaging but the basic operating principle has not changed. An example CMOS image system 200 may be coupled to or include an excitation source 206, a wavelength filter 216 and a detector 202. The wavelength filter 216 may discriminate between excitation light 220 and emission photons 222 by significantly reducing the excitation light intensity reaching the detector 202 while allowing through as much of the weak fluorescence signal 222 as possible. The emission light 222 may be in the order of $10^{-4}$ to $10^{-6}$ of the excitation light and therefore it may be advantageous to have high attenuation at $\lambda_{ex}$ and low attenuation at $\lambda_{em}$.

Fluorescence imaging may be used in areas such as cell analysis, diagnosis bioengineering and pharmaceutical and genomic research. Therefore, one requirement of the filter 216 may be bio-compatibility with the object of interest 218. This may require minimizing the impact on cell physiology while protecting the sensor array 208 from damage by exposure to the biological environment. This example includes an absorption filter 216 according to the present embodiments. For example, the absorption filter 216 may include poly-acrylic acid sodium salt solution due its optical transparent properties, adhesive properties, miscibility with polar protic solvents and most importantly its bio-compatibility with a biological environment. Such an embodiment may yield a filter in the red spectrum, utilizing the increased quantum efficiency of the photo sensitive sensor array 208.

In one embodiment, the absorption filter 216 may have rejection around −60 dB and transmittance close to 0 dB, with a roll-off of 20 nm or less. The filter 216 thickness may be a few mico-meters. In a particular embodiment, this filter 216 may be excited in the green spectrum with emission in the red spectrum, taking advantage of the increased Quantum efficiency of photodetectors 202. For example, a sample filter 216 designed according to the present embodiments was observed to have a rejection of −60 dB and transmittance of −1.6 dB with a roll-off of 20 nm using a 20 μm thick filter.

In certain embodiments, the thickness of the filter may easily be improved by changing the absorbing specimen (The astrazon Orange G dye in this case) to one with a higher molar absorptivity. Due to the miscibility of poly-acrylic acid with all the polar protic solvents (water, Formic Acid, Methanol, Ethanol, Propanol, Isopropanol, Butanol and Acetic Acid) the dye can be changed and a thinner filter may be fabricated.

The one example an absorption filter 216 is based on three parts: (1) a polar protic solvent, (i.e., Ethyl-alcohol 95%), (2) an absorbing specimen, in this case Astrozan Orange G dye, and (3) an adhesive to conform the solution into a solid filter. The present example uses poly-acrylic acid (PAA) partial sodium salt solution as the adhesive. The PAA solution may be advantageous, in certain embodiments, because of its optically transparent properties, when cured, it conforms to a strong non-elastic solid, it's miscibility with polar protic solvents and most importantly its bio-compatibility with a biological environment. If the PAA is optically transparent, the analysis of the filters spectra may be based almost solely on the absorbing dye particles.

The PAA may be miscible with the polar protic solvents (a solvent that has a hydrogen atom bound to an oxygen atom); therefore the present embodiments may include solvents such as water, Formic Acid, Methanol, Ethanol, Propanol, Isopropanol, Butanol and Acetic Acid to dissolve the Astrazon Orange G dye. This example embodiments includes ethyl-alcohol 95% because of its high solubility with the dye, 50 mg/ml. After the solvent is mixed with the dye, 1 ml of solution may be added to 1 ml of PAA and the filter may be let to cure until the ethyl-alcohol fully evaporates.

Figure 4:
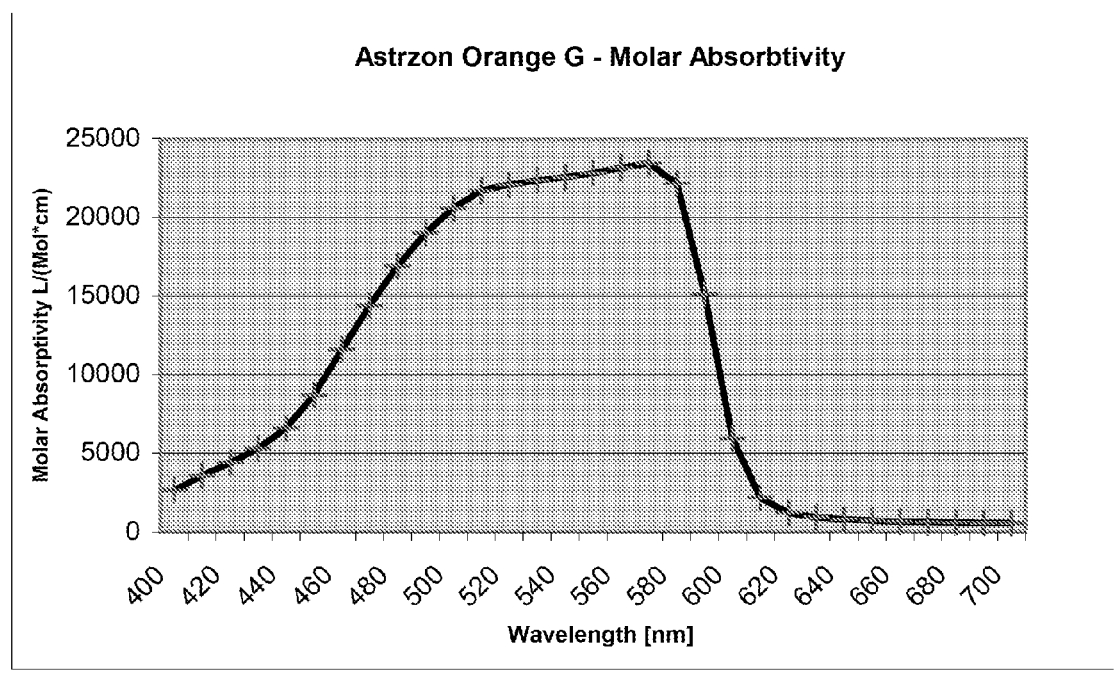
FIG. 4 is a graphical representation of aborbtivity of Astrazon Orange G dye as a function of wavelength.

According to Beer Lambert's Law for liquids absorbance becomes a linear equation:

$$A = \epsilon * l * c$$

Where A is the absorbance, l is the thickness of the filter and c is the concentration of absorbing species in the material. Therefore once a dye is chosen, the two parameters left in the filter design may be the concentration and the thickness. The molar absorbtivity of the Astrazon Orange G dye as a function of wavelength is displayed in FIG. 4 to illustrate one example of the absorption specimen.

The Astrazon Orange G dye may dissolve best in the ethyl-Alcohol 95% solvent to achieve a concentration of 50 mg/ml. Any larger concentrations may produce dye aggregation which may cause non-uniformity to the filter 216. To calculate the desired thickness of the filter 216 the SNR as the ratio of number of electrons produced from the fluorophore to the number of electrons produced due to excitation light in the CMOS sensor array for one pixel may be analyzed. To simplify calculation it may be assumed that the excitation light has a Gaussian profile, the fluorophore is a point source with isotropic emission light and the inventors neglect any optical path losses after the filter to the sensor array. Under these assumptions, the minimum filter's thickness to yield a desired SNR may be calculated.

To determine the light power density in W/m²:

$$I\left(\frac{W}{m^2}\right) = \Phi * \frac{hc}{\lambda}(J) = q\Phi \frac{1.24}{\lambda(um)}$$

With the photon flux is defined as:

$$\Phi = \frac{\# \text{ of photons}}{\sec * m^2}$$

From Beer Lambert's law the inventors can derive that transmittance T is:

$$T = \frac{I_i}{I_0} = 10^{-\varepsilon lc}$$

The fluorescence quantum yield may be defined as the ratio of the number of photons emitted to the number of photons absorbed. The quantum yield for most fluorophore's is between $10^{-4}$ to $10^{-6}$, to calculate the SNR we'll take the worst case of $10^{-6}$.

Figure 5:
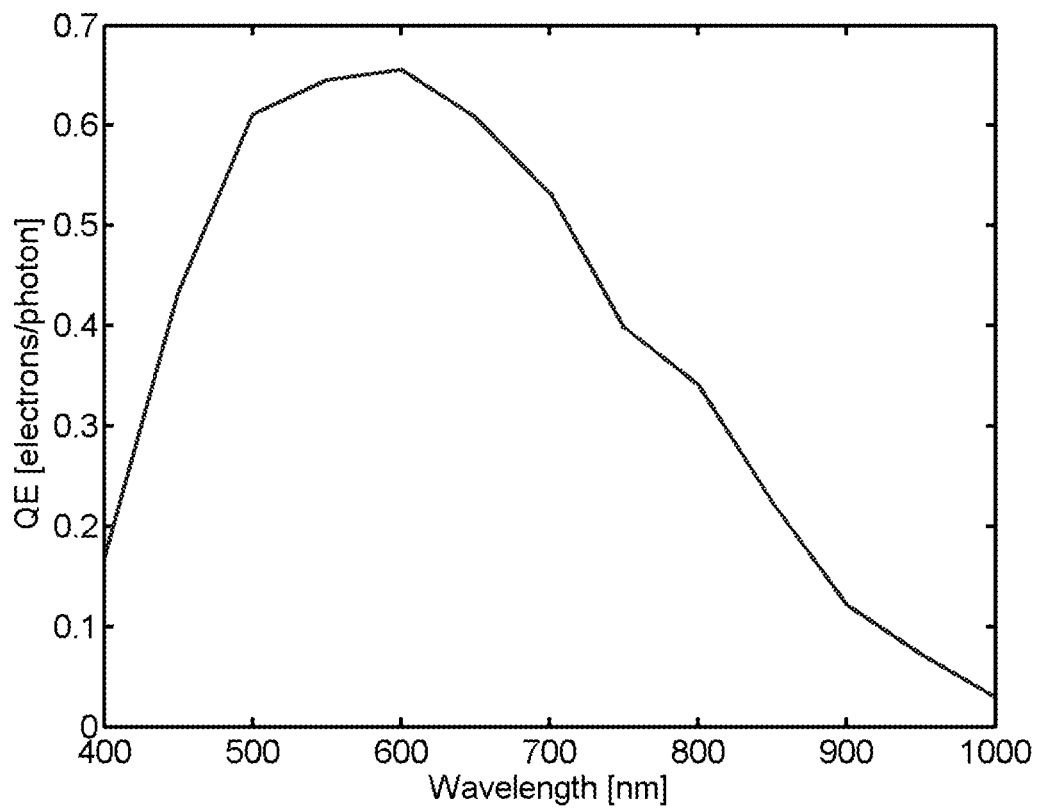
FIG. 5 is a graphical representation of QE of an n-well over p-substrate photodiode.

The quantum efficiency:

$$QE_\lambda = \eta = \frac{N_E}{N_v}$$

Where where $N_e$=number of electrons produced, $N_v$=number of photons absorbed. The filter 216 may be integrated on a CMOS contact imager 202, and therefore, the measured QE may be used to calculate the filters SNR. See FIG. 5. Additionally, as shown in FIG. 5 the QE for the present example may be highest in the red spectrum. Thus, the specific example of the combination of Astrazon Orange G and Ethyl alcohol used with PAA may produce a red filter and therefore utilizes the increased QE of the sensor array 208.

Figure 6:
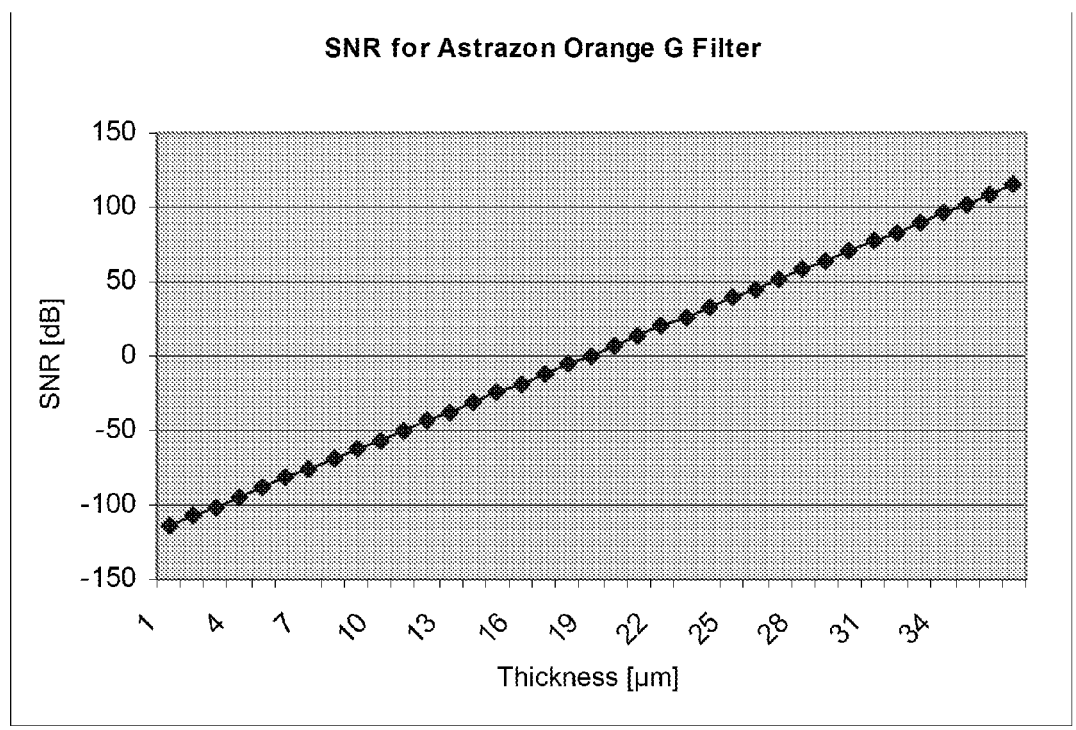
FIG. 6 is a graphical representation of a calculated SNR as a function of the filters thickness.

As shown in FIG. 6. a filter thickness of 20 μm may yield a positive SNR. In one embodiment, for contact imaging the maximum distance that the object under test may be from the sensor array 208 is 100 μm. If the object is farther then 100 μm contrast degradation may become an issue. Therefore the design of a 20 μm thick filter may satisfy the required maximum distance for contact imaging.

Figure 7:
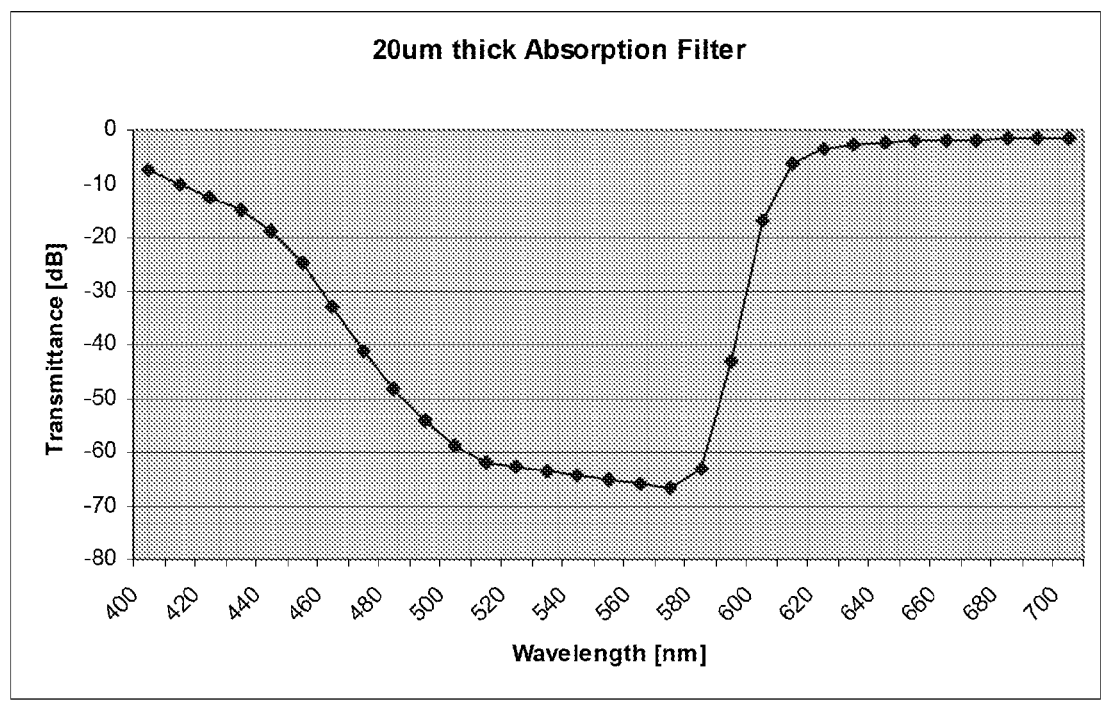
FIG. 7 is a graphical representation of sample results from one embodiment of a 20 μm thick absorption filter having a concentration of 50 gm/ml of Astrazon Orange G dye dissolved in Ethyl-Alcohol 95%. The filter is hardened using the Poly-Acrylic Acid partial sodium salt solution as an optically transparent adhesive.

The example filter was spun on a glass slide to the desired thickness and tested using a Newport monochromator and a Kiethley 6485 Picoammeter. The results are shown in FIG. 7. As measured, this embodiment of the filter has max attenuation of −66 dB at 570 nm and minimum attenuation of −1.6 dB at 650 nm. With a roll-off of 20 nm the filter allows good contrast imaging and is suitable for low light fluorescence detection.

Figure 8:
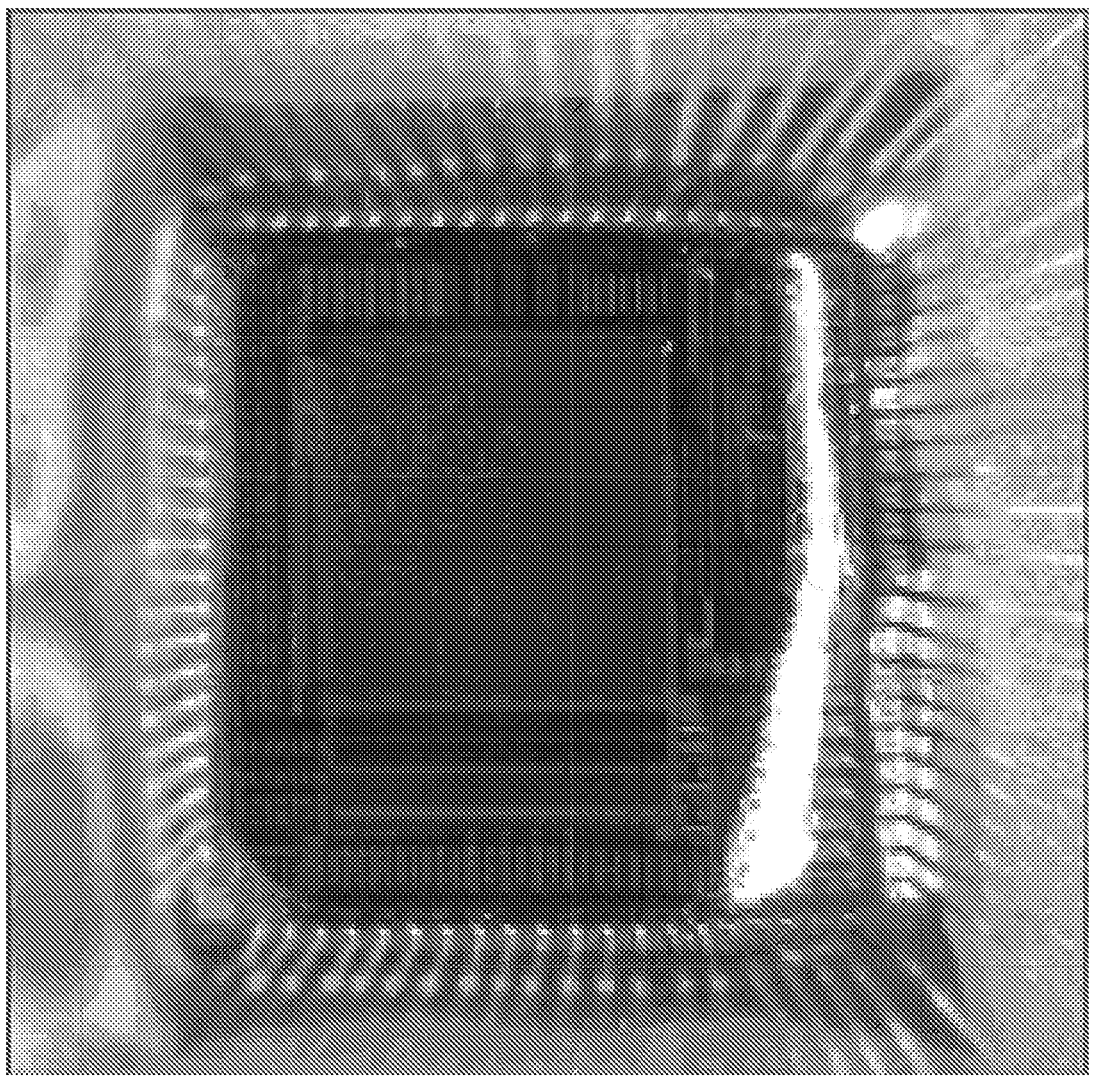
FIG. 8 is a photograph illustrating one embodiment of a CMOS Contact Imager coated with RTC silicon Sealant, apart from the sensor array.

Using a room temperature vulcanizing (RTV) silicon sealant by Vishay® (M-Coat C), the exposed parts of the CMOS imager 202 may be covered apart from the sensor array 208. This material was selected mainly due to its higher viscosity and rapid curing properties, in addition to its chemical resistance to many solvents. See FIG. 8. The filter 216 may be poured onto the sensor array 208 and the RTV silicon sealant 214 may act as a wall for the liquid filter until it cures. The desired filters thickness may be achieved by changing the height of the RTV sealant. Once the filter 216 cures it hardens and the bio-material under test 218 can be placed on the surface.

In another example, an absorption filter for Ca2+ imaging is disclosed. The active fluorophores in this example is FURA-2 fluorescent dye. *Lymnaea stagnalis*' neurons of size 50 to 100 micrometers are loaded with 10 micromole of FURA-2. FURA-2 has excitation peak at 340 nm and 380 nm and emission peak at 510 nm. As before the absorption filter is based on three components: a protic solvent (e.g. Methyl-alcohol 95%), an absorbing specimen (e.g. Benzophenone-8 (2,2-hydroxy-4-methoxybenzophone)), and an adhesive to conform the solution into a solid filter. Benzphenone-8 may be chosen because it blocks the excitation wavelengths and transmits the emission light and its bio compatibility. Benzphenone-8 is commonly used in cosmetics and UV skin protection products. It is important to fit the absorption and transmission spectrum of the absorbing specimen to the excitation and emission spectrum of the fluorescent dye. For instance, in this example, one may not want to use Astrozan Orange G dye because it may pass the excitation spectrum but block the emission spectrum.

In this example, a polyvinyl acetate (PVAc) adhesive is used instead of Poly Acrylic Acid (PAA). Both a PAA solution and a PVAc are optically transparent, adhesive, miscible with protic solvents and, most importantly, bio-compatible with a biological environment. When cured, the PVAc, like the PAA solution, conforms to a strong non-elastic solid and it is miscible with polar protic solvents. It is important that the adhesive be optically transparent so the analysis of the filter's spectra is based solely on the absorbing dye particles. The PVAc is miscible with protic solvents, which allows for the use of solvents such as Acetone, Methanol, Ethanol, Propanol, Isopropanol, Butanol and Acetic Acid to dissolve the Benzphenone-8 dye. Protic solvents are usually not harmful. Some of them, such as Acetone and Ethanol, can be found in households. For this specific example Methyl-alcohol 95% (methanol) is used because Benzophenone-8 and PVAc exhibit high solubility in it. Also, unlike some other protic solvents (ie. Acetone) Methyl-alcohol does not melt plastic on contact. The proportions used are 1 gr, 4 gr and 10 ml of Benzophenone-8, PVAc and Methanol accordingly. After the solvent is complete it may be applied to the needed surface. The filter may be left to cure until the methanol is fully vaporized. The filter is suitable for excitation wavelengths from 340 nm to 380 nm and emission from 420 nm and above. The filter has max attenuation of −80 B at 340 nm and minimum attenuation of −1 dB at 510 nm. With a roll-off of 30 nm the filter allows good contrast imaging and is suitable for low light fluorescence detection.

Figure 9A:
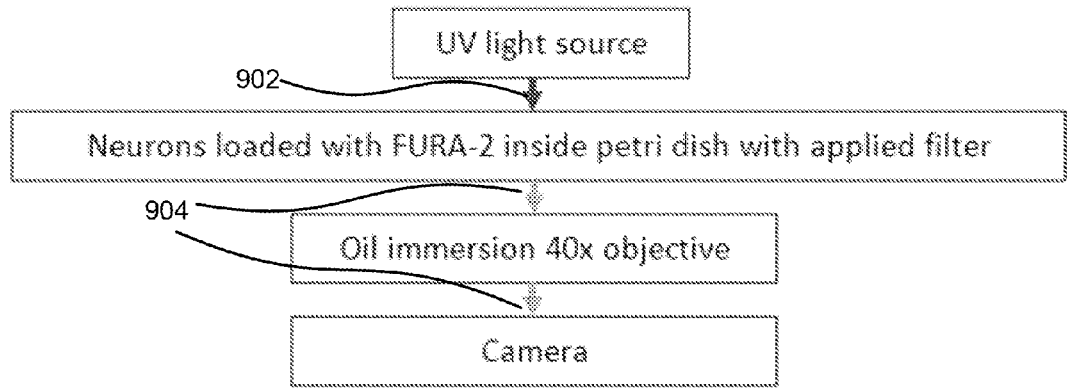
FIG. 9A is a block diagram of a system used to capture neuron fluorescence images with a Bensophenone-8 absorption filter.

An experiment was conducted to compare the Benzophenone-8 filter to a DAPI dichroic filter. For testing and comparison purposes a filter of approximately 15 μm was applied to a petri dish. *Lymnaea stagnalis*' neurons were loaded with FURA-2 and placed in the petri dish. The neurons were imaged by conventional fluorescence microscope with the inbuilt fluorescence filter removed under 340 nm excitation light. The block diagram is shown in FIG. 9A. Arrow 902 represents the excitation light, and arrows 904 represent the emission light.

Figure 9B:
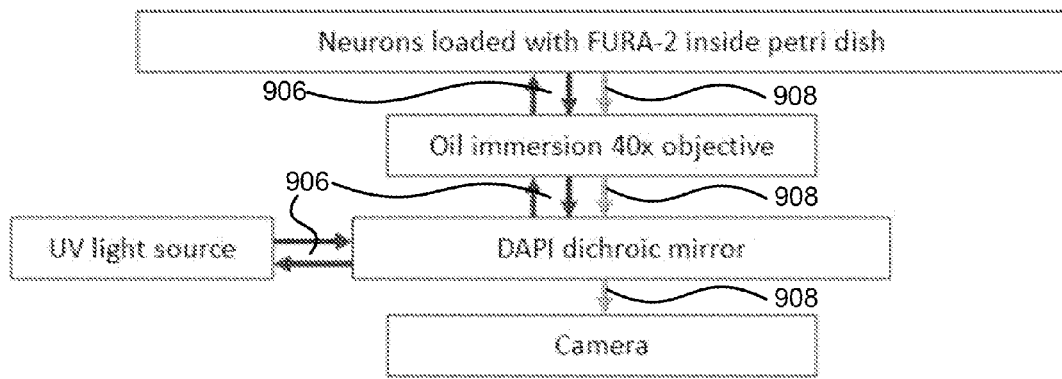
FIG. 9B is a block diagram of a system used to capture neuron fluorescence images with a DAPI dichroic filter.

The filter was then dissolved using methanol, and the neurons were imaged again by using the system with the system's native filter. This system utilizes a DAPI dichroic filter which reflects the excitation light and transmits the emission light. The system uses the DAPI for two purposes. The DAPI filter directs the excitation light through the objective on to the sample and afterwards it rejects the remaining excitation light. A block diagram of this configuration is shown in FIG. 9B. Arrows 906 represent the excitation light and arrows 908 represent emission light.

Figure 10A:
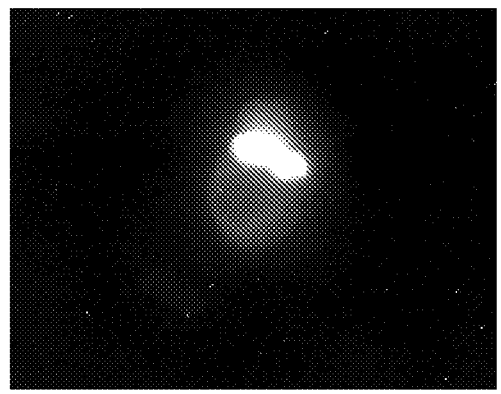
FIG. 10A shows a captured image of a neuron using a DAPI dichroic filter and an exposure time of 1 second.
Figure 10B:
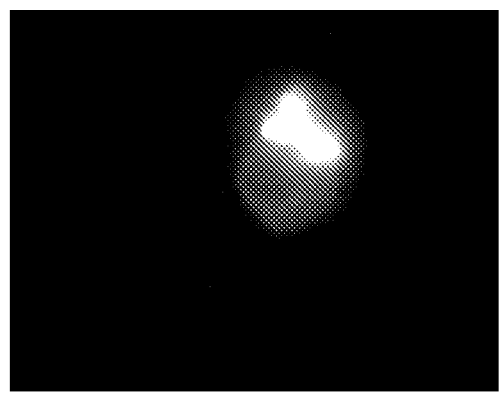
FIG. 10B shows a captured image of a neuron using a Bensophenone-8 absorption filter and an exposure time of 0.1 second.
Figure 10C:
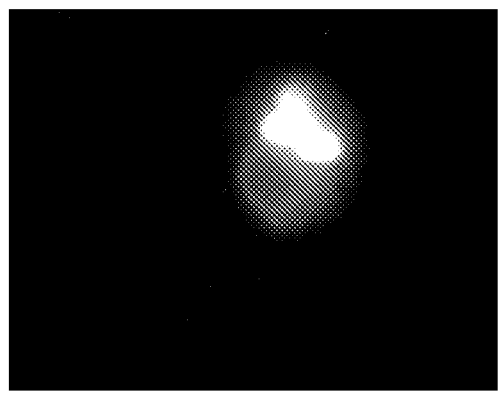
FIG. 10C shows a captured image of a neuron using a Bensophenone-8 absorption filter and an exposure time of 0.12 second.

Comparison images are presented in FIGS. 10A-C. All images are of the same neuron. All images were captured within minutes one from another, by the same system. The camera settings for all images have the same gain and offset but different integration time. FIG. 10A was captured using a DAPI dichroic filter with an integration time of 1 second, FIG. 10B was captured using a Benzophenone-8 filter with an integration time of 0.1 second, and FIG. 10C was captured using the Benzophenone-8 filter with an integration time of 0.12 second.

Figure 11A:
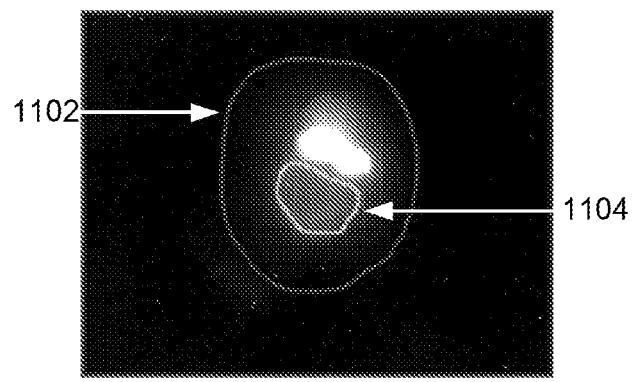
FIG. 11A shows the neuron measurement of FIG. 10A and includes perimeter boundaries for background and neuron measurements.

FIGS. 10B and 10C (Benzophenone-8 filter) show a uniform dark background while FIG. 10A (DAPI dichroic filter) shows some noise in the background and bad pixels due to the high integration time. In order to compare the images an analysis of gray levels was performed. Mean gray level of the neuron and of the background were measured for FIGS. 10A-C. FIGS. 11A (DAPI dichroic filter) and 11B and 11C (Benzophenone-8 filter) show the neuron and the background boundaries for the three measurements in 10A-C, respectively. The boundaries of the background measurement are shown by perimeters 1102, 1106, and 1108 in FIGS. 11A, 11B, and 11C, respectively. The boundaries of the neuron measurements are shown by perimeters 1104, 1108, and 1112 in FIGS. 11A, 11B and 11C, respectively. The following table shows the mean gray levels within the perimeters shown in FIGS. 11A-C.

Figure 11B:
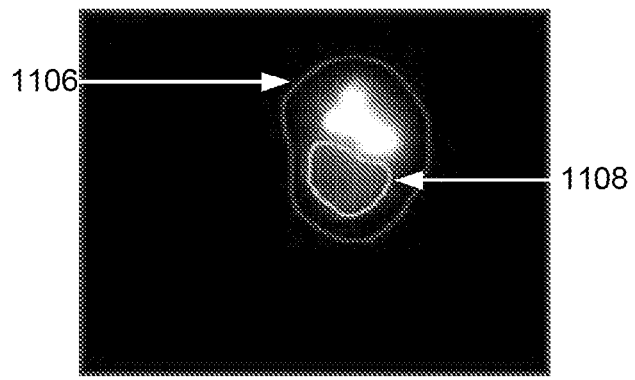
FIG. 11B shows the neuron measurement of FIG. 10B and includes perimeter boundaries for background and neuron measurements.
Figure 11C:
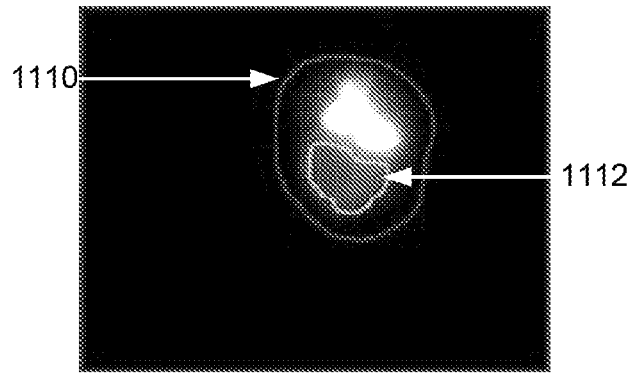
FIG. 11C shows the neuron measurement of FIG. 10C and includes perimeter boundaries for background and neuron measurements.

| Mean gray level | FIG. 11A | FIG. 11B | FIG. 11C |
| --- | --- | --- | --- |
| Neuron | 61 | 50 | 62 |
| Background | 3 | 0 | 0 |

From the comparison it can be seen that the performance of the native DAPI dichroic filter at exposure time of 1 second is approximately equal to the performance of the Benzophenone-8 absorption filter with an exposure time between 0.1 to 0.12 seconds. Therefore, the Benzophenone-8 absorption filter is superior to the DAPI dichroic filter at blocking the excitation light and transmitting the emission light by approximately a factor of 9! Additionally, due to the low exposure time the Benzophenone-8 absorption filter produces images with superior SNR and superior resolution in the time-domain. The measurements have less background noise.

What is claimed is:

1. A filter apparatus comprising:
    a solution comprised of:
        a polar protic solvent; and
        an absorbing specimen; and
    an adhesive to conform the solution into a solid filter.
2. The filter apparatus of claim 1, where the polar protic solvent comprises ethyl-alcohol.
3. The filter apparatus of claim 1, where the polar protic solvent comprises methyl-alcohol.
4. The filter apparatus of claim 1, where the absorbing specimen comprises a dye.
5. The filter apparatus of claim 4, where the dye is an Atrozan Orange G dye.
6. The filter apparatus of claim 1, where the absorbing specimen is Benzophenone-8 (2,2-hydroxy-4-methoxybenzophone).
7. The filter apparatus of claim 1, where the adhesive comprises a poly acrylic acid partial sodium salt solution.
8. The filter apparatus of claim 1, where the adhesive comprises polyvinyl acetate.
9. The filter apparatus of claim 1, where the filter absorbs a substantial portion of light having a wavelength in the range of 510 nm to 570 nm.
10. The filter apparatus of claim 1, where the filter passes a substantial portion of light having a wavelength in the range of 620 nm to 680 nm.
11. The filter apparatus of claim 1, where the filter absorbs a substantial portion of light having a wavelength in the range of 340 nm and 380 nm.
12. The filter apparatus of claim 1, where the filter is configured to provide an attenuation of −80 dB for light having a wavelength of 340 nm.
13. The filter apparatus of claim 1, where the filter passes a substantial portion of light having a wavelength of 510 nm.
14. The filter apparatus of claim 1, where the filter if configured to provide an attenuation of −1 dB for light having a wavelength of 510 nm.
15. A system comprising:
    a Complimentary Metal-Oxide Semiconductor (CMOS) imager having a sensor array;
    an absorption filter coupled to the sensor array, the filter comprising:
        a solution comprised of:
            a polar protic solvent; and
            an absorbing specimen; and
        an adhesive to conform the solution into a solid filter.
16. The system of claim 15, further comprising a light source configured to direct light toward the sensor array.
17. A method of manufacturing an absorption filter comprising:
    providing a polar protic solvent;
    preparing a solution by dissolving an absorbing specimen in the polar protic solvent;
    preparing a mixture by mixing the solution with an adhesive;
    pouring the mixture over a sensor array to a desired thickness; and
    curing the mixture.
18. The method of claim 17, further comprising spinning the mixture before it cures.
19. The method of claim 17, further comprising providing a predetermined arrangement of a Room Temperature Vulcanizing (RTV) sealant to act as a barrier for the mixture until the mixture is cured.

20. The method of claim 18, where a thickness of the absorption filter is set according to a thickness of the RTV sealant.

\* \* \* \* \*